United States Patent [19]

Asai et al.

[11] Patent Number: 4,740,136
[45] Date of Patent: Apr. 26, 1988

[54] METHOD AND APPARATUS FOR TAKING ELECTRONIC COMPONENT OUT OF CARRIER TAPE

[75] Inventors: Koichi Asai, Nagoya; Mamoru Tsuda, Okazaki; Yasuo Muto, Chiryu; Sinsuke Suhara, Nagoya, all of Japan

[73] Assignee: Fuji Machine Mfg. Co., Ltd., Aichi, Japan

[21] Appl. No.: 925,790

[22] Filed: Oct. 31, 1986

[30] Foreign Application Priority Data

Nov. 6, 1985 [JP] Japan .................. 60-249869

[51] Int. Cl.⁴ ............................................. H05K 13/00
[52] U.S. Cl. .................... 414/787; 29/426.3; 29/426.4; 29/740; 29/743; 29/822; 221/74; 414/416; 414/786
[58] Field of Search .............. 414/416, 403, 411, 417, 414/786, 787; 29/426.3, 822, 791, 809, DIG. 78, 700, 740, 743, 426.4; 221/74

[56] References Cited

U.S. PATENT DOCUMENTS 3,906,614  9/1975  Rayburn .................. 414/417 X
4,494,902  1/1985  Kuppens et al. .......... 221/74 X

FOREIGN PATENT DOCUMENTS 55-118698  9/1980  Japan .
57-140000  8/1982  Japan .
57-148875  9/1982  Japan .
60-152100  8/1985  Japan .
61-89435   6/1986  Japan .
318102     1/1957  Switzerland ............ 414/416

*Primary Examiner*—L. J. Paperner
*Assistant Examiner*—Stuart J. Millman
*Attorney, Agent, or Firm*—Parkhurst & Oliff

[57] ABSTRACT

A method of taking an electronic component or chip out of each of plural pockets which are formed at regular intervals along a longitudinal direction of a carrier tape and which have openings in the upper surface of the tape, through vacuum suction of a suction member, while the tape is intermittently fed in a feeding direction parallel to its longitudinal direction, including the steps of: (a) bringing the pockets having the chips, into a position where their openings are covered with a covering device having a notch with a width narrower than that of the chip and wider than that of the suction member; (b) feeding the tape by the regular interval in the feeding direction, and permitting a leading chip of the chips covered with the covering device to be brought into a suction position where the leading chip is right below the suction member and the notch; (c) lowering the suction member through the notch so as to allow the suction member to suck and hold the leading chip; (d) retracting the covering device while the tape is kept stationary, so as to clear the covering device from above the leading chip held by the suction member; and (e) lifting the suction member to take the leading chip out of the pocket. An apparatus for taking a chip out of a carrier tape is also disclosed.

12 Claims, 6 Drawing Sheets

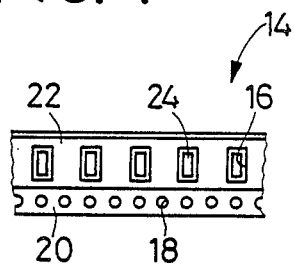
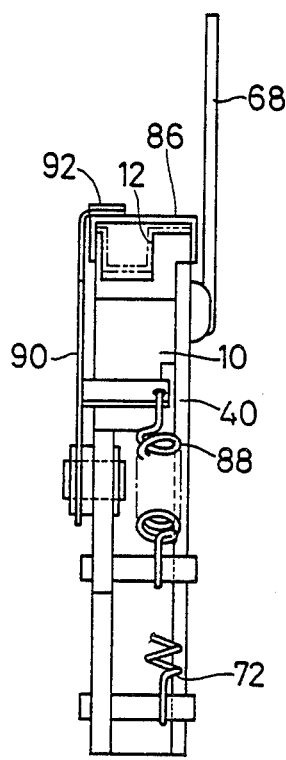
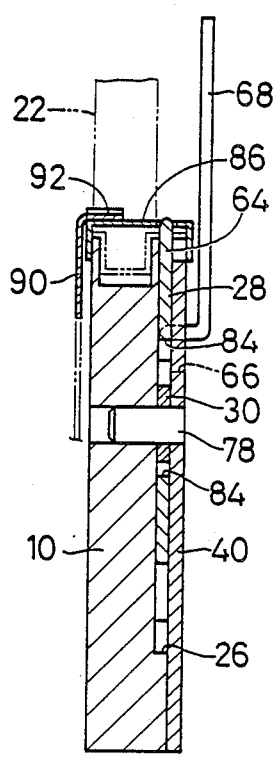
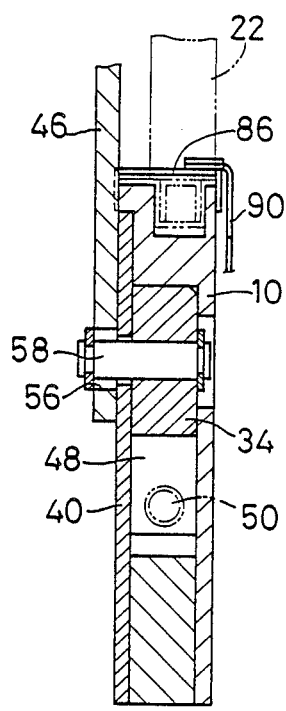

(a)

(b)

METHOD AND APPARATUS FOR TAKING ELECTRONIC COMPONENT OUT OF CARRIER TAPE

BACKGROUND OF THE INVENTION

The present invention relates to a method and apparatus for taking an electronic component in the form of a chip out of each of a number of electronic-component holding pockets which are formed at regular intervals along a longitudinal direction of a carrier tape and which have openings in the top face thereof.

Japanese Laid-Open Patent Application Publication No. 55-118698 (1980) discloses a carrier tape which has a number of pockets, each holding therein an electronic component, at regular intervals along the longitudinal direction of the tape. Such a carrier tape is used as means for feeding an electronic component in the form of a chip to an electronic-component mounting apparatus which serves for mounting the chip on a printed circuit board. In the case where the carrier tape is used for feeding an electronic component, it is usual to intermittently feed the carrier tape a predetermined distance by means of a tape-feeding device so as to position or stop each holding pocket at a location right below a suction member, and to lower the suction member so as to allow the suction member to suck and hold the electronic component in the holding pocket and take the electronic component out of the holding pocket while the carrier tape is stopped.

However, in the above-indicated process for taking an electronic component out of a carrier tape, the electronic component often jumps out of the holding pocket or changes its posture in the holding pocket, owing to shock resulting from starting and stopping of the intermittent movement of the tape and/or vibration of the tape-feeding device. In order to solve this problem, the above-identified Japanese Laid-Open Patent Application shows disposing a cover over the top surface of the carrier tape so as to cover the openings of the holding pockets.

Such a cover, however, is not satisfactory. The cover must have a window through which the electronic component is taken out, and consequently the electronic component often jumps out through the window before being sucked and held by the suction member, owing to shock resulting from stopping of the tape or other causes. The electronic component often changes its posture owing to sucking action of the suction member while the suction member is lowered.

SUMMARY OF THE INVENTION

It is therefore an object of the present invention to provide a method and apparatus for taking an electronic component out of an electronic-component holding pocket of a carrier tape without errors.

It is another object of the invention to provide a method and apparatus for taking an electronic component out of an electronic-component holding pocket of a carrier tape in a shorter time.

According to a first aspect of the present invention, there is provided a method of taking an electronic component in the form of a chip out of each of a number of chip-holding pockets, which are formed at regular intervals along a longitudinal direction of a carrier tape and which have openings in a top surface of the tape, while the carrier tape is intermittently fed in a feeding direction parallel to the longitudinal direction of the tape, the method, utilizing a suction member which has an air-suction hole open in a lower face thereof for the purpose of taking the chip out of each chip-holding pocket, including the steps of: (a) bringing at least one of the chip-holding pockets having a chip therein into a position in which the opening of the at least one pocket is covered with covering means which has a notch with a width narrower than that of the chip and wider than that of the suction member; (b) feeding the carrier tape a distance equal to the regular interval in the feeding direction, and permitting a leading chip of the at least one chip covered with the covering means to be brought into a suction position in which the leading chip is right below the suction member and right below the notch; (c) lowering the suction member through the notch of the covering means so as to allow the suction member to suck and hold the leading chip; (d) retracting the covering means while the carrier tape is kept in a stationary state, so as to clear the covering means from above the leading chip held by the suction member; and (e) lifting the suction member so as to take the leading chip out of the chip-holding pocket.

Since the width of the notch of the covering means (one or more covering members) is narrower than that of the chip, the chip-holding pocket having the chip therein is kept substantially covered with the covering means all the time, until the chip is sucked and held by the suction member once the pocket is brought into a position under the covering means. Therefore, there is no possibility of the chip jumping out of the pocket or changing its posture in the pocket, due to shock resulting from starting and stopping of the tape and/or vibration of a device for feeding the tape. Further, there is no possibility of the chip jumping toward the suction member which is sucking air, before the suction member is sufficiently lowered. Thus, the chip is taken out of the carrier tape without errors. From this point of view, the present method of the invention has an improved reliability. Moreover, the present method permits the carrier tape to be fed at a higher speed, contributing to shortening of the cycle time required for feeding one chip.

In a preferred embodiment of the first aspect of the present invention, the covering means includes a covering member and the notch extends upstream in the feeding direction from a downstream end of the covering member. The covering member is retracted in a retracting direction opposite to the feeding direction.

In a preferrd form of the above embodiment of the method of the invention, the covering member and the carrier tape are concurrently fed by the regular interval distance in the feeding direction so as to bring the leading chip into the suction position, after the leading chip is brought into a position in which the leading chip is right below the notch of the covering member.

In another form of the above embodiment, the leading chip is brought into the suction position by means of feeding the carrier tape by the regular interval distance in the feeding direction, while the notch of the covering member is in a position in which the notch is right below the suction member.

In yet another form of the above embodiment, the leading chip is brought into a position in which the leading chip is right below the suction member, by means of feeding the carrier tape by the regular interval distance in the feeding direction, and subsequently the covering member is retracted in the retracting direction so as to bring the notch into a position in which the notch is right below the suction member and right above the leading chip, permitting the leading chip to be in the suction position.

In a further form of the above embodiment, the suction member is lowered, while the covering member is in a stationary state.

In a still further form of the above embodiment, a time period in which the suction member is lowered at least partially overlaps a time peiod in which the covering member is retracted in said retracting direction.

In a yet further form of the above embodiment, the carrier tape has a cover film for covering the opening of the chip holding pockets, the cover film being removed from the carrier tape below the covering member so that the openings of the chip-holding pockets are uncovered while being covered with the covering member.

According to a second aspect of the present invention, there is provided an apparatus for taking an electronic component out of each of a number of electronic-component holding pockets, which are formed at regular intervals along a longitudinal direction of a carrier tape and which have openings in a top surface of the tape, while the carrier tape is intermittently fed in a feeding direction parallel to the longitudinal direction of the tape, including: (a) a guide member for guiding the carrier tape in the feeding direction; (b) a tape-feeding device for intermittently feeding the carrier tape a distance equal to the regular interval in the feeding direction; (c) a suction member having an air-suction hole open in a lower face thereof, and disposed right above the electronic component at one of plural stops of the electronic component, the suction member being lowered to suck and hold the electronic component by vacuum suction through the air-suction hole and then being lifted to take the electronic component out of each holding pocket; (d) covering means for covering the opening of at least one of the holding pockets; (e) a notch formed in said covering means and having a width narrower than that of the electronic component and wider than that of the suction member; (f) a driving device for moving the covering means into a first position in which the notch is right below the suction member and also into a second position apart from the first position.

In a preferred embodiment of the second aspect of the invention, the covering means comprises a covering member, and the notch extends upstream in the feeding direction from a downstream end of the covering member. The second position is upstream of the suction member as seen in the feeding direction.

In a preferred form of the above-indicated embodiment of the apparatus according to the second aspect of the invention, the carrier tape has a number of engagement holes at regular intervals along the longitudinal direction of the tape, and the tape-feeding device has a feeding member, the feeding member being engaged with at least one of the engagement holes of the carrier tape, being moved in the feeding direction while being engaged with the at least one engagement hole, being disengaged from the at least one engagement hole, and being retracted in a retracting direction opposite to the feeding direction. The covering member is connected to the feeding member so that the covering member and the feeding member are moved together with each other in the same direction.

In another form of the above embodiment, the guide member is elongated in the feeding direction and has a guide groove in a top face thereof for guiding the carrier tape, and the covering member has an inverted-U-letter shape in cross section, the covering member being slidably mounted on the guide member such that each of two lateral walls of the covering member is in sliding contact with a corresponding one of two lateral faces of the guide member, so that the guide groove is covered with the covering member.

BRIEF DESCRIPTION OF THE DRAWINGS

The foregoing and other objects, features and advantages of the present invention will be better understood by reading the following description of examples of the invention, when considered in connection with the accompanying drawings, in which:

FIG. 3 is a left-side elevational view of the apparatus of FIG. 1;

FIG. 4 is a plan view of part of a carrier tape which is used with the apparatus of FIG. 1;

FIG. 5 is a cross sectional view taken along line V—V of FIG. 1;

FIG. 6 is a cross sectional view taken along linve VI—VI of FIG. 1;

DETAILED DESCRIPTION OF THE PREFERRED EMBODIMENTS

There will be illustrated in detail preferred embodiments of the present invention with reference to the accompanying drawings.

Figure 1:
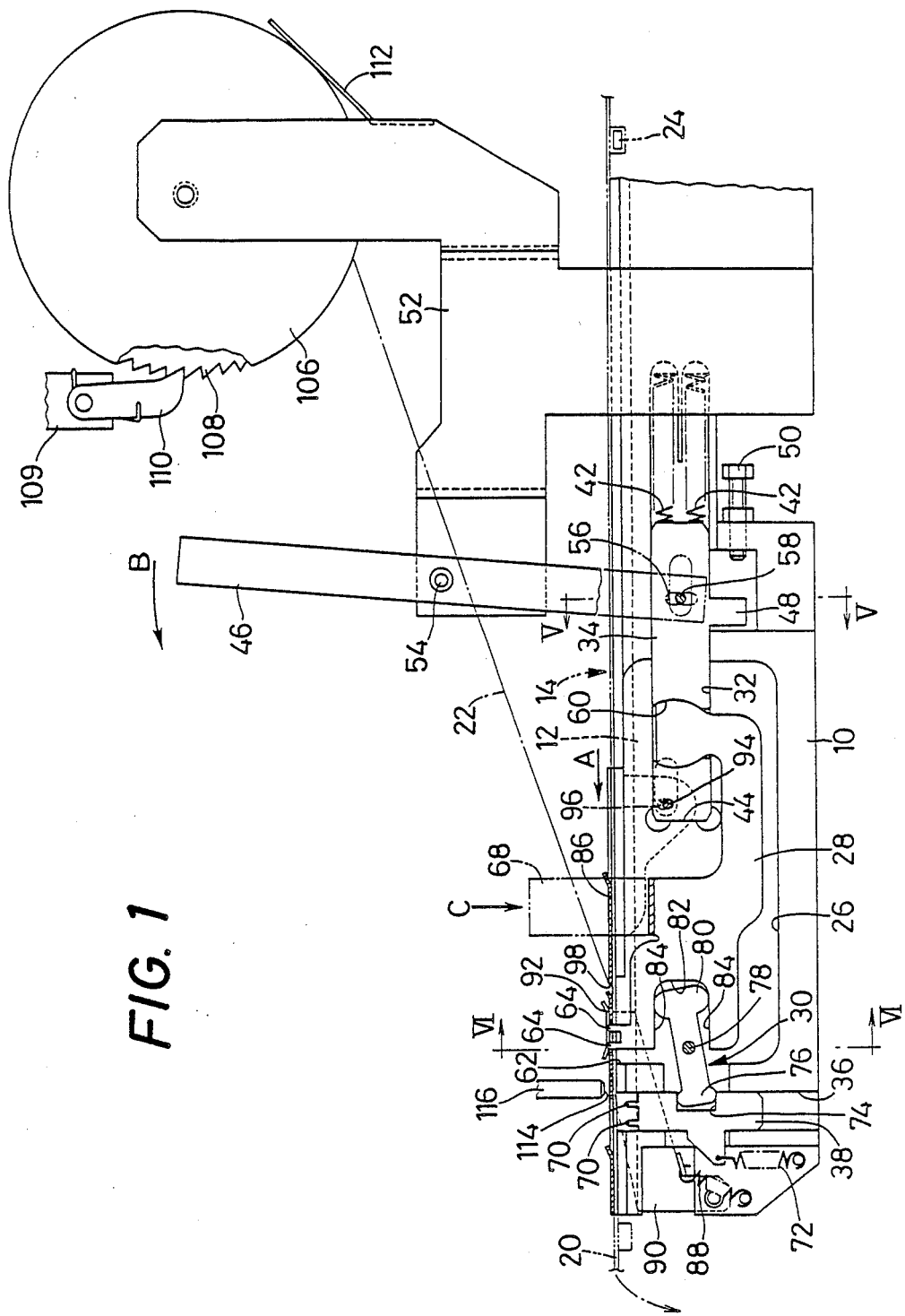
FIG. 1 is a front elevational view of an embodiment of an apparatus according to the present invention, with its front panel removed.
Figure 2:
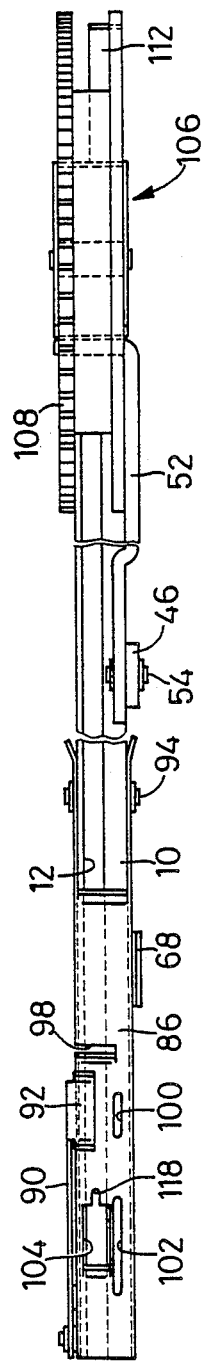
FIG. 2 is a plan view of the apparatus of FIG. 1.

Referring first to the front elevational view of FIG. 1, there is shown an apparatus according to the present invention to which a method of the invention is applied. In the figure, a front panel of the apparatus is removed for showing an internal construction of the apparatus. FIGS. 2 and 3 are a plan view and a left-side elevational view of the apparatus of FIG. 1, respectively. In these figures, reference numeral 10 designates a guide member in the form of a block. The block 10 has a rectangular guide groove 12 formed in a top face thereof. The guide groove 12 guides a tape member 14 in a feeding direction A (indicated at arrow A, FIG. 1) parallel to a longitudinal direction of the tape member 14. As clearly shown in FIG. 4, the tape member 14 has a carrier tape 20, and supports an electronic component in the form of a non-lead chip (hereinafter referred to as the chip) 24 in each of a number of rectangular chip-holding pockets (hereinafter referred to as the pockets) 16. The pockets 16 are formed at regular intervals along the longitudinal direction of the carrier tape 20 and have openings in a top surface of the tape 20. A number of engagement holes 18 are formed at regular intervals along the longitudinal direction of the carrier tape 20. The tape member 14 also has a thin, transparent cover film 22 which is adhered to the top surface of the carrier tape 20 so as to cover the openings of the pockets 16. With the tape member 14 guided by the guide groove 12, the holding pockets 16 are located in a rectangular space in the guide groove 12. The tape member 14 is fed into the guide groove 12 from a reel (not shown).

The block 10 has a shallow recess 26 in its front face in which a feeding member in the form of a feeding plate 28 and a lever 30 are accommodated. A rectangular guide recess 32 is formed upstream of the shallow recess 26 as seen in the feeding direction A, such that the guide recess 32 is deeper than the shallow recess 26 and partially overlaps the shallow recess 26. The guide recess 32 extends parallel to the feeding direction A. In the guide recess 32 is slidably fitted a slider member 34. The block 10 has a guide recess 36 downstream of the shallow recess 26 as seen in the feeding direction A. The guide recess 36 is as deep as the shallow recess 26 and extends in a direction normal to the feeding direction A. In the guide recess 36 is slidably fitted a positioning member 38. In FIG. 3, there is shown a front panel 40 disposed over the front face of the block 10.

The slider member 34 is advanced by a pair of springs 42, 42 disposed in the guide recess 32, into an advanced position thereof in which the front end of the slider member 34 is in contact with a wall 44 of the guide recess 32, while the slider member 34 is retracted by a return bar 46 against the biasing force of the springs 42, 42 into a retracted position thereof in which a boss 48 of the slider member 34 is in contact with a stopper bolt 50. The return bar 46 is attached using a pin 54 to a bracket 52 secured to the block 10, such that the bar 46 is rotatable about the pin 54. As shown in the sectional view of FIG. 5, the return bar 46 has at its lower-end portion an elongate hole 56 which is engaged with a pin 58 formed on the slider member 34. The return bar 46 is rotated in a direction B (indicated at arrow B, FIG. 1) by a first cam device (not shown). The slider member 34 is reciprocated between its advanced position and its retracted position, depending upon the biasing force exerted by the springs 42, 42 and the force resulting from the rotational movement of the return bar 46, respectively. The stroke of the slider member 34, i.e., a distance between the advanced position and the retracted position of the slider member 34, is adjustable to the regular interval of the pockets 16 of the carrier tape 20, by means of changing the retracted position of the slider member 34 by way of altering the screwed length of the stopper bolt 50. The first cam device for actuating the return bar 46 can normally function even when the rotation angle of the return bar 46 is altered due to the changed retracted position of the slider member 34.

The feeding plate 28 has a generally circular rear end which is rotatably fitted in a generally circular recess 60 formed in a front-end portion of the slider member 34. The circular recess 60 is as deep as the shallow recess 26. Thus, the feeding plate 28 is reciprocated forward and backward together with the slider member 34. The feeding plate 28 has at its front end portion a pair of feeding pins 64, 64 which are adpated to come out through a window 62 in a top surface of the block 10. The distance between the pair of feeding pins 64, 64 is as long as the regular interval between two adjacent engagement holes 18, 18 of the carrier tape 20, so that the feeding pins 64, 64 and the engagement holes 18, 18 are engageable with each other. On the other hand, the window 62 has a length which permits the feeding pins 64, 64 to be easily displaced a distance equal to the maximum stroke of the slider member 34 in the feeding direction A. Therefore, as the feeding plate 28 and the slider member 34 are advanced with the feeding pins 64, 64 engaged with the engagement holes 18, 18, the carrier tape 20 is fed a distance corresponding to the stroke of the slider member 34, that is a distance equal to the regular interval between two adjacent pockets 16, in the feeding direction A. The members 28, 34, 42, 46, 64 cooperate with each other to serve as a tape-feeding device of the apparatus.

As shown in FIG. 6, the feeding plate 28 has at its intermediate part a driven portion 68 which protrudes laterally of the instant apparatus through a window 66 formed in the front panel 40 and which further extends upward. The driven portion 68 is driven or moved downward as indicated at arrow C (FIG. 1) by a second cam device (not shown). Thus, the feeding plate 28 is rotated about its circular rear end, fitted in the circular recess 60 of the slider member 34, until the feeding plate 28 is brought into a disengagement position thereof in which the feeding pins 64, 64 are disengaged from the engagement holes 18, 18. In this case, the lever 30 serves for rotating the feeding plate 28 from its disengagement position to an engagement position thereof in which the feeding pins 64, 64 are engaged with the engagement holes 18, 18. The second cam device for actuating the driven portion 68 permits the feeding plate 28 to be in its disengagement position while the feeding plate 28 is being retracted from its advanced position to its retracted position. On the other hand, the second cam device permits the feeding plate 28 to be in its engagement position while the feeding plate 28 is being advanced from its retracted position to its advanced position. A distance between the feeding pins 64, 64 and the circular rear end of the feeding plate 28 is comparatively long, so that the feeding pins 64, 64 are moved downward and upward substantially normally to the feeding direction A. The window 66 of the front panel 40 has a length which permits the driven portion 68 to be easily displaced as the feeding plate 28 is reciprocated.

The positioning member 38 is provided with a pair of positioning pins 70, 70, like the feeding pins 64, 64, which are engageable with the engagement holes 18, 18 of the carrier tape 20. The positioning member 38 is lowered by a spring 72, which is at its one end secured to the block 10, into a lower (disengagement) position thereof in which the positioning pins 70, 70 are disengaged from the engagement holes 18, 18. The positioning member 38 has a recess 74 with which the lever 30 is engaged at an end portion 76 thereof. The positioning member 38 is elevated by the lever 30 against the biasing force of the spring 72, into an upper (engagement) position thereof in which the positioning pins 70, 70 are engaged with the engagement holes 18, 18.

As shown in the cross sectional view of FIG. 6, the lever 30 is attached using a pin 78 to the block 10 such that the lever 30 is rotatable about the pin 78. The lever 30 is engaged, at an end portion 80 thereof other than the end portion 76, with a recess 82 formed in the feeding plate 28. An upper wall and lower wall 84, 84 of the recess 82 are formed generally parallel to the feeding direction A and substantially normal to a direction in which the feeding plate 28 is moved to be brought into its engagement position and into its disengagement position. The recess 82 has a length which permits the feeding plate 28 to be advanced in the feeding direction A and retracted in a retracting direction opposite to the feeding direction A, while the feeding plate 28 is engaged with the end portion 80 of the lever 30. The engagement of the lever 30 with the feeding plate 28 and with the positioning member 38 is adapted to permit the feeding plate 28 to be in its engagement position when the positioning member 38 is in its lower position, and to be in its disengagement position when the positioning member 38 is in its engagement position. Therefore, when the feeding plate 28 is lowered by the second cam device from its engagement position to its disengagement position, this downward movement of the feeding plate 28 is transformed into a rotational movement of the lever 30 which in turn causes the positioning member 38 to be brought into its engagement position. On the other hand, when the feeding plate 28 is permitted to be moved from its disengagement position to its engagement position, the positioning member 38 is lowered by the biasing force of the spring 72 from its engagement position to its disengagement position in which the pins 70, 70 are apart from the engagement holes 18, 18 of the tape 20. This downward movement of the positioning member 38 is transformed into a rotational movement of the lever 30, which in turn causes the feeding plate 28 to be lifted into its engagement position.

As shown in FIG. 1 covering means in the form of a covering member 86 is disposed in front of the slider member 34 over the guide groove 12, such that the covering member 86 is rotatable about a pin 94 secured to the slider member 34. The covering member 86 has an inverted-U-letter shape in cross section, and cooperates with the guide groove 12 to guide the tape member 14. The covering member 86 is pressed on the tape member 14 by an active portion 92 of a holder member 90 which is biased by a spring 88 in a direction which causes the covering member 86 to be pressed on the tape member 14. The covering member 86 has an elliptic hole 96 through which the covering member 86 is attached to the pin 94 of the slider member 34. The elliptic hole 96 of the covering member 86 permits the covering member 86 to be lifted a little for varied thickness of the tape member 14. The covering member 86 is moved forward and backward together with the feeding plate 28, as the slider member 34 is advanced and retracted in the guide recess 32. As shown in FIG. 2, in the covering member 86 are formed a slot 98 through which the cover film 22 removed from the carrier tape 20 is drawn out, a slot 100 through which the feeding pins 64, 64 come up, a slot 102 through which the positioning pins 70, 70 come up, and a window 104 through which the chip 24 is taken out. The window 104 is larger than the pocket 16. The part of the covering member 86 which is located downstream of the window 104, as seen in the feeding direction A, serves for pressing the carrier tape 20, while the part of the covering member 86 which is located upstream of the window 104 serves not only for pressing the carrier tape 20 but also for preventing the chip 24 from jumping out of the pocket 16 and/or from changing its posture. The members 34, 42, 46, 94 cooperate with each other to serve as a coveringmeans driving device of the apparatus.

The cover film 22 drawn out through the slot 98 is taken up by a take-up reel 106 rotatably secured to the bracket 52. The take-up reel 106 is intermittently rotated a predetermined angle by a drive device which includes a ratchet wheel 108, elevator member 109, ratchet 110 and brake 112. The elevator member 109 is moved up and down by a third cam device (not shown) so as to drive the ratchet wheel 108 at suitable time intervals. The rotation of the ratchet wheel 108 causes the take-up reel 106 to take up the cover film 22. In this connection, it is noted that the take-up reel 106 and the elevator member 109 are stopped when the cover film 22 is removed from the carrier tape 20 over a predetermined length, so that a further removal of the cover film 22 is ceased at the covering member 86. In this case, a spring (not shown) disposed between the elevator member 109 and the third cam device absorbs the downward force of the third cam device which is to be transmitted to the elevator member 109. The third cam device permits the elevator member 109 to be moved up in the case where the take-up reel 106 is rotated in the reverse direction so as to let out some of the cover film 22 which has been taken up thereby.

Above the covering member 86, there is disposed a cylindrical suction member 116 which has an air-suction hole open in its lower face 114 and which is lowered and lifted by a drive device (not shown). The chip 24 is taken out of the pocket 16 of the carrier tape 20 by the suction member 116 by means of vacuum suction through the air-suction hole, after the chip 24 is positioned right below the suction member 116. A device which Japanese Utility Model Application No. 59-173666 discloses is advantageously used as the suction member 116. The disclosed device is lowered to a lower position in which the device is pressed down on the chip 24 by a biasing force of a spring, then lifted up to an upper position holding the chip 24, and further moved to a position in which the device mounts the chip 24 at a predetermined spot on a mount member.

The covering member 86 also has a notch 118 which extends upstream in the feeding direction A from an upstream end of the window 104. The notch 118 has a width (as seen in a direction normal to the feeding direction A) which is narrower than that of the chip 24 and wider than the diameter of the suction member 116. The length of the notch 118 (as seen in the feeding direction A) is a little larger than that of the chip 24.

Hereinafter there will be described the operation of the instant apparatus for taking the chip 24 out of the pocket 16 while at the same time removing the cover film 22 from the carrier tape 20.

Initially, the second cam device (not shown) is in its rest mode in which the cam device is not working on the driven portion 68 of the feeding plate 28, i.e., is not depressing the driven portion 68. The feeding plate 28 is in its upper (engagement) position in its advanced position, while the positioning member 38 is in its lower (disengagement) position. Next, the carrier tape 20 is inserted with the leading end thereof through the guide groove 12 below the covering member 86. When the carrier tape 20 is fed in the guide groove 12 in the feeding direction A, the covering member 86 may be moved up and down against the biasing force of the spring 88 which is exerted on the covering member 86 through the holder member 90, permitting the engagement holes 18 to be engaged with the feeding pins 64 of the feeding plate 28 in its upper position. On the other hand, an extension of the cover film 22 which is joined to the leading end of the carrier tape 20 is drawn out through the slot 98, and wound around the take-up reel 106. Thus, the step for mounting the carrier tape 20 on the apparatus is finished, and then the apparatus is positioned in its auto mode in which the apparatus is automatically operated for feeding the carrier tape 20. The steps for bringing the apparatus into its constant automatic-operation condition following the step for mounting the carrier tape 20 will not be described here because they are not important for the present invention. The following is the description about the steps carried out after the apparatus is brought into its constant automatic-operation condition.

Figure 7A:
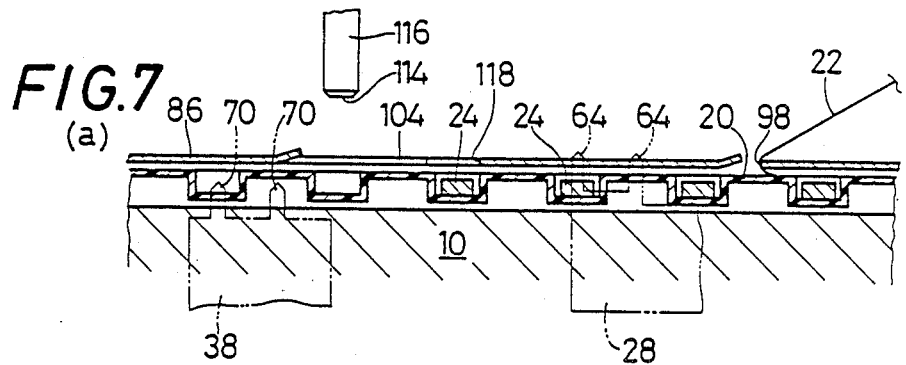
FIGS. 7(a) through 7(c) are illustrative views in cross section of an embodiment of a method according to the invention.
Figure 8:
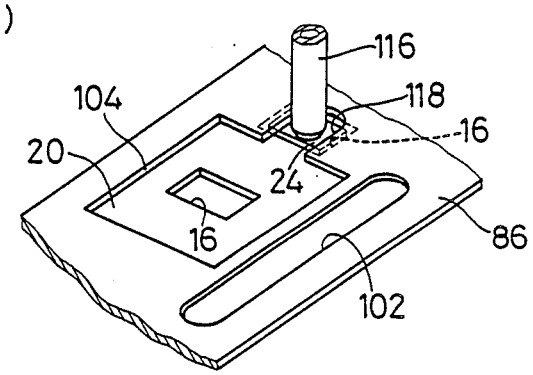
FIG. 8(a) is a perspective view showing a chip which is sucked and held by a suction member in the method of FIG. 7.
FIG. 8(b) is a perspective view showing a covering member after having been retracted in its retracted position in the method of FIG. 7.
Figure 8:
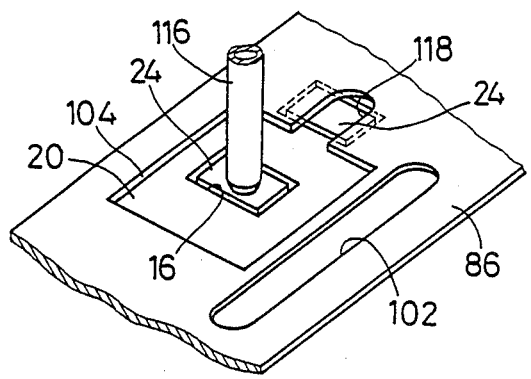

After the feeding plate 28 is brought into it retracted position by the return bar 46, the second cam device (not shown) stops depressing the driven portion 68 so as to permit the positioning member 38 to be brought into its disengagement position by the spring 72 and the feeding plate 28 to be brought into its engagement position by the driven portion 68. Thus, the feeding pins 64, 64 are brought into engagement with the engagement holes 18, 18 of the carrier tape 20 which is pressed on the top surface of the block 10 under the covering member 86, as shown in FIG. 7(a). In this figure, the pockets 16 which have the chips 24 and from which the cover film 22 has been removed are covered with the covering member 86, and the leading one of such pockets 16 is positioned right below the notch 118 of the covering member 86. Since the width of the notch 118 is narrower than that of the chip 24, the opposite ends of the chip 24 (as seen in the direction normal to the feeding direction A) are covered with the part of the covering member 86 which defines the notch 118, as clearly shown in FIG. 8(a).

Figure 7B:
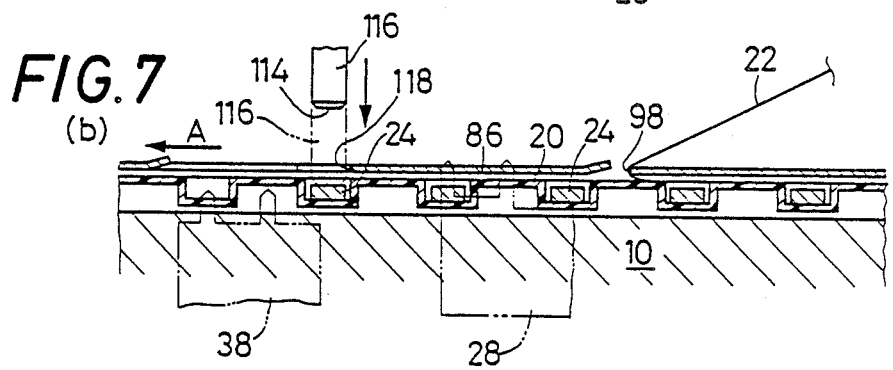

Subsequently, the first cam device (not shown) stops pressing the return bar 46, permitting the slider member 34 to be advanced by the springs 42, 42. Thus, the carrier tape 20 is fed by the regular interval of the pockets 16 (hereinafter referred to as the regular interval) in the feeding direction A together with the covering member 86. As shown in FIG. 7(b), the leading one of the chip-containing pockets 16 is positioned right below the notch 118 and the suction member 116. This step is referred to as the carrier-tape feeding step. In the carrier-tape feeding step, the chip 24 is likely to hop or jump in the pocket 16 owing to vibration resulting from movement of the slider member 34 and the feeding plate 28 and/or shock resulting from starting and stopping of the same members 34, 28. However, the chip 24 never jumps out of the pocket 16 or turns itself on its side or upside down in the pocket 16, since the chip 24 is covered with the covering member 86, or with the part of the covering member 86 which defines the notch 118 in the case where the chip 24 is right below the notch 118. Further, in the carrier-tape feeding step, the take-up reel 106 is rotated in the reverse direction, i.e., a direction opposite to the regular direction in which the reel 106 takes up the removed cover film 22. In other words, some of the taken-up cover film 22 is fed out of the take-up reel 106, as the carrier tape 20 is fed forward. Subsequently, the second cam device is brought into its operation mode in which the cam device despresses the driven portion 68, so that the feeding plate 28 is brought into its disengagement position in which the feeding pins 64, 64 are apart from the engagement holes 18, 18 of the carrier tape 20. At the same time, the positioning member 38 is brought into its engagement position in which the positioning pins 70, 70 are engaged with the engagement holes 18, 18, so as to stop the carrier tape 20 in position.

After the carrier tape 20 is stopped in position, the suction member starts sucking air while being lowered. As indicated in two-dot chain line in FIG. 7(b), and in FIG. 8(a), the suction member 116 passes through the notch 118 and is brought at its lower face 114 into contact with the upper surface of the chip 24 so as to suck and hold the chip 24. This step is referred to as the chip-sucking step. In the chip-sucking step, i.e., when the suction member 116 is lowered toward the chip 24, the chip 24 never stands up in the pocket 16 or jumps out of the pocket 16 due to the vacuum suction of the suction member 116, since the chip 24 is right below the notch 118 with its opposite ends (as seen in the direction normal to the feeding direction A) covered with the covering member 86. Thus, the suction member 116 sucks and holds the chip 24 without errors.

After the chip 24 is held by the suction member 116, the feeding plate 28 in its disengaged, advanced position is retracted toward its retracted position together with the covering member 86, as the return bar 46 is driven in the direction B by the first cam device (not shown). This step is referred to as the covering-member-retracting step. As the covering member 86 is retracted toward its retracted position, the chip 24 held by the suction member 116 is moved relative to the covering member 86. Eventually the chip 24 is positioned at the central portion of the window 104, as clearly shown in FIG. 8(b), and does not have any part of the covering member 86 thereabove. As the suction member 116 is lifted up from its lower position in which the suction member 116 has sucked the chip 24, the chip 24 is taken out of the pocket 16. This step is referred to as the chiptaking-out step.

Figure 7C:
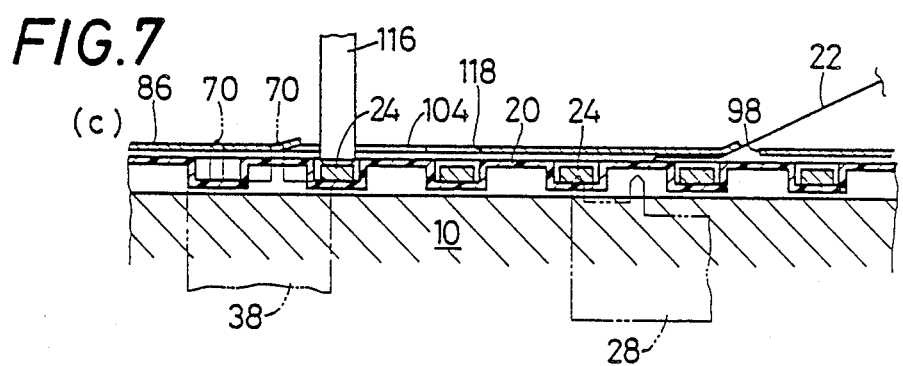

When the covering member 86 is retracted toward its retracted position in the covering-member-retracting step indicated above, the leading one of the pockets 16 which still have the cover film 22 passes under the slot 98 in the feeding direction A, as shown in FIG. 7(c). Consequently, some of the cover film 22 which has been just removed from the carrier tape 20 is folded back on the above-indicated leading pocket 16 which still has the cover film 22. In other words, double layers of the cover film 22 are held between the covering member 86 and the carrier tape 20 of the leading pocket 16.

While the chip 24 is being taken out of the pocket 16 by the suction member 116, the elevator member 109 is under the downward force of the third cam device (not shown), and consequently the take-up reel 106 is rotated in the regular direction. The cover film 22 is taken up by the take-up reel 106 through the slot 98 of the covering member 116, and subsequently removed off the carrier tape 20 from a location in FIG. 7(c) to a location at the slot 98 in FIG. 7(a). A further removal of the cover film 22 from the carrier tape 20 is prevented at the covering member 86, more specifically at one edge of the slot 98. When the cover film 22 is removed from the carrier tape 20, the carrier tape 20 is likely to produce vibration which will cause the chip 24 to hop or jump. However, there is no possibility of the chip 24 being caught at its end or edge by the slot 98, since the leading pocket 16 has passed the slot 98 when the cover film 22 of the pocket 16 is removed. On the other hand, the above-identified double layers of the cover film 22 are held in the clearance between the covering member 86 and the carrier tape 20. Since the cover film 22 is very thin and therefore the clearance between the two member 86 and 20 may be very thin, there is no possibility of the chip 24 being jammed or caught in this very thin clearance.

After the chip 24 is taken out of the pocket 16, the positioning member 38 is brought into its disengagement position, permitting the carrier tape 20 to be fed forward in the feeding direction A. The feeding plate 28 is brought into its engagement position, and the feeding pins 64, 64 are engaged with the engagement holes 18, 18.

Each time the feeding plate 28 is advanced, disengaged, retracted, and engaged, the carrier tape 20 is fed by the regular interval in the feeding direction A, and positioned with accuracy by the positioning member 38 which is correspondingly engaged and disengaged. With the carrier tape 20 positioned by the positioning member 38, the chip 24 is taken out of each pocket 16, one chip at a time. Also, each time the chip 24 is taken out of the pocket 16, the cover film 22 is removed from the carrier tape 20 over a length equal to the regular interval, and taken up by the take-up reel 106.

As is understood from the foregoing description, the illustrated embodiment of the invention enjoys an advantage of preventing the chip 24 from jumping out of the pocket 16 or turning itself on its side in the pocket 16 even though the chip 24 hops or jumps in the pocket 16 owing to shock resulting from starting, feeding or stopping of the carrier tape 20 and/or vibration resulting from movement of various parts of the apparatus. Another advantage is that of sucking and holding the chip 24 with accuracy. The present embodiment has a further advantage of taking the chip 24 out of the holding pocket 16 without errors, owing to accurate positioning of the carrier tape 20 which is carried out independently of the feeding of the carrier tape 20. Since there is no possibility of the chip 24 jumping out of the pocket 16 or turning itself on its side in the pocket 16, the cover film 22 and the carrier tape 20 may be removed and fed at a higher speed, respectively. In the case where the cover film 22 and the carrier tape 20 are removed and fed at a higher speed, the cycle time, which is a time required for feeding a chip 24, is shortened.

Further, since the removal of the cover film 22 from the carrier tape 20 is carried out under the covering member 86, but not below the slot 98, the chip 24 is prevented from being jammed at its end or edge into the slot 98 of the covering member 86.

The present apparatus is simpler and more compact in construction since the covering member 86 is driven together with the feeding plate 28 for feeding the carrier tape 20 by the simple slider member 34, in comparison with an apparatus which is adapted to drive each of the carrier tape 20 and the covering member 86 individually. Furthermore, the present apparatus is thin, i.e., small-dimensioned in the direction normal to the feeding direction A, since the feeding plate 28 and the positioning member 38 are displaced in the same plane parallel to the feeding direction A. In the case where a number of apparatuses are disposed parallel to each other for the purpose of feeding various kinds of electronic components (chips), the aboveindicated construction of each apparatus will minimize the space to be occupied by the number of apparatuses. In this case, the small-width construction of each apparatus will contribute to decreasing a length between both ends of the numerous paralleldisposed apparatuses. The decreased length between both ends of the numerous apparatuses results in decreasing a distance in which an electronic-component receiving member (e.g., the suction member 116) must be moved relative to the number of apparatuses for receiving an electronic component from each apparatus. Hence, the cycle time, that is a time required for feeding a chip 24, may be shortened.

While the present invention has been described in its preferred embodiment with a certain degree of particularity, it is to be understood that the invention may be otherwise embodied.

For example, a covering member 86 and a feeding plate 28 may be advanced and retracted independently of each other, although the previously-illustrated embodiment has the covering member 86 and the feeding plate 28 being driven together. In this case, a chip 24 of a carrier tape 20 may be fed forward into a suction position in which a pocket 16 (chip 24) is right below a notch 118 and a suction member 116, after the covering member 86 is located in a position in which the notch 118 is right below the suction member 116.

While the illustrated embodiment employs the covering member 86 as covering means, the covering means may consist of a flat covering member having a notch 118 and an inverted-U-shaped covering member at the rear end of the flat member. In this case, the flat covering member may be advanced and retracted in a direction different from the feeding direction A, for example in a direction normal to the direction A, while the inverted-U-shaped member is stationary. In the case where the flat covering member is moved in the direction normal to the feeding direction A, the notch 118 must be formed to extend in the direction normal to the feeding direction A. An electronic component (chip) 24 in a pocket 16 is prevented from being sucked up toward the suction member 16 or being jammed with the edge of the notch 118, since the chip 24 is covered with the part of the flat covering member which defines a bottom portion of the notch 118.

While in the illustrated embodiment the suction member 116 starts to suck and hold a chip 24 after the carrier tape 20 is stopped at the position in which the leading chip 24 is right below the suction member 116, it is possible to start the suction member 116 while the carrier tape 20 is being moved.

Figure 9:
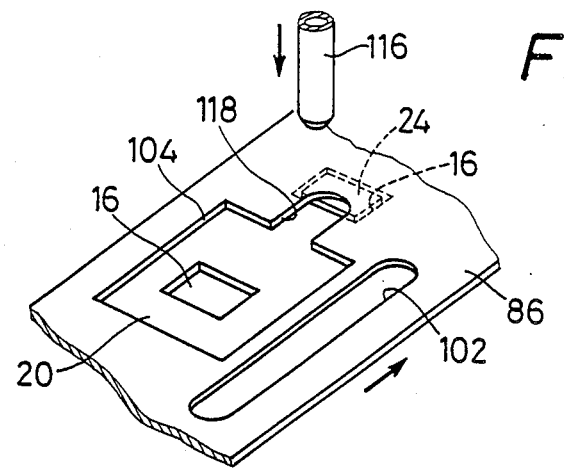
FIG. 9(a) is an illustrative view of another embodiment of the method of the invention, showing in perspective a suction member and a covering member which are being lowered and retracted, respectively, concurrently with each other.
FIG. 9(b) is a perspective view showing a chip sucked and held by the suction member, corresponding to FIG. 8(a)
FIG. 9(c) is a perspective view showing the covering member after having been retracted, corresponding to FIG. 8(b).
Figure 9:
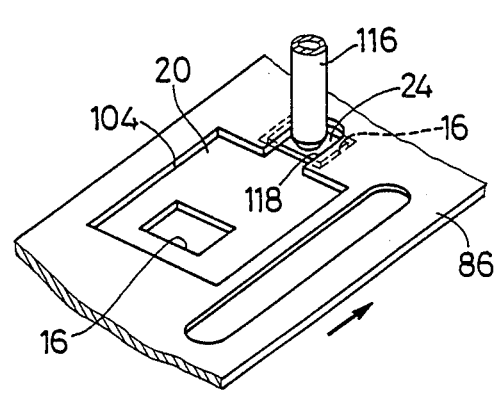
Figure 9:
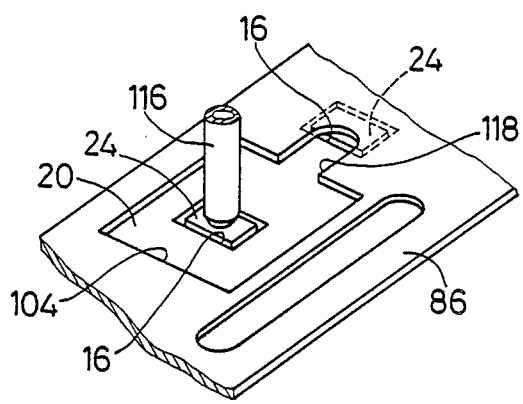

Furthermore, there is shown another embodiment of the present invention in FIGS. 9(a) through 9(c). In this embodiment, a covering member 86 is retracted in the retracting direction opposite to the feeding direction A, so as to bring a notch 118 into a position right below the suction member 116, after a chip 24 is positioned right below the suction member 116. In FIG. 9(a), a carrier tape 20 has been fed by the regular interval to be positioned where a pocket 16 having a chip 24 is right below the suction member 116. An opening of the pocket 16 right below the suction member 116 is covered with the covering member 86 over two thirds of the opening as seen in the feeding direction A. Subsequently, the suction member 116 and the covering member 86 are lowered and retracted, respectively, concurrently with each other. FIG. 9(b) shows the suction member 116 which keeps hold of the chip 24 by means of its sucking action. In the figure, the chip 24 and the pocket 16 are exposed right below the notch 118 extending in the feeding direction A, but partially covered with the covering member 86. The chip 24 is covered at its opposite ends as seen in the direction normal to the feeding direction A, since the width of the notch 118 is narrower than that of the chip 24. Therefore, the chip 24 never stands up in the pocket 16 while the suction member 116 is lowered sucking air. Thus, the suction member 116 sucks and holds the chip 24 without errors. FIG. 9(c) shows the covering member 86 which has been retracted from the position in FIG. 9(b) to its retracted position. In this figure, the chip 24 and the pocket 16 are positioned at the central portion of the window 104, and have no covering thereabove. The suction member 116 is then lifted to take the chip 24 out of the pocket 16.

As the carrier tape 20, various types of tapes other than the exemplifed one may be used. Further, the device for feeding the carrier tape 20 may be of another type, for example of a type using a sprocket which is intermittently rotated a predetermined angle.

It is to be understood that the present invention may be embodied with various improvements, modifications, and changes which may occur to those skilled in the art, but without departing from the spirit and concept of the invention.

What is claimed is:

1. A method of taking an electronic component in the form of a chip out of each of a number of chip-holding pockets, which are formed at regular intervals along a longitudinal direction of a carrier tape and which have openings in a top surface of said tape, while said carrier tape is intermittently fed in a feeding direction parallel to the longitudinal direction of said tape, the method, utilizing a suction member which has an air-suction hole open in a lower face thereof for the purpose of taking said chip out of each chip-holding pocket, comprising the steps of:

bringing at least one of said chip-holding pockets having said chip therein into a position in which said opening of said at least one pocket is covered with covering means which has a notch with a width narrower than that of said chip and wider than that of said suction member;

feeding said carrier tape a distance equal to said regular interval in said feeding direction, and permitting a leading chip of said at least one chip to be brought into a suction position in which said leading chip is right below said suction member and said notch;

lowering said suction member through said notch of said covering means so as to allow the suction member to suck and hold said leading chip;

retracting said covering means while said carrier tape is kept in a stationary state, so as to clear said covering means from above said leading chip held by said suction member; and lifting said suction member so as to take said leading chip out of said chip-holding pocket.

2. A method according to claim 1, wherein said covering means comprises a covering member and said notch extends upstream in said feeding direction from a downstream end of said covering member, said covering member being retracted in a retracting direction opposite to said feeding direction.

3. A method according to claim 2, wherein said covering member and said carrier tape are concurrently fed by said distance in said feeding direction so as to bring said leading chip into said suction position after the leading chip is brought into a position in which the leading chip is right below said notch of the covering member.

4. A method according to claim 2, wherein said leading chip is brought into said suction position by means of feeding said carrier tape by said distance in said feeding direction while said notch of said covering member is in a position in which the notch is right below said suction member.

5. A method according to claim 2, wherein said leading chip is brought into a position in which the leading chip is right below said suction member by means of feeding said carrier tape by said distance in said feeding direction, and subsequently said covering member is retracted in said retracting direction so as to bring said notch into a position in which the notch is right below said suction member and right above the leading chip, permitting the leading chip to be in said suction position.

6. A method according to claim 2, wherein said suction member is lowered while said covering member is in a stationary state.

7. A method according to claim 2, wherein a time period in which said suction member is lowered at least partially overlaps a time period in which said covering member is retracted in said retracting direction.

8. A method according to claim 2, wherein said carrier tape has a cover film for covering said opening of said chip holding pockets, said cover film being removed from the carrier tape below said covering member so that the openings of the chip-holding pockets are uncovered while being covered with said covering member.

9. An apparatus for taking an electronic component out of each of a number of electronic-component holding pockets, which are formed at regular intervals along a longitudinal direction of a carrier tape and which have openings in a top surface of said tape, while said carrier tape is intermittently fed in a feeding direction parallel to said longitudinal direction of said tape, comprising:

a guide member for guiding said carrier tape in said feeding direction;

a tape-feeding device for intermittently feeding said carrier tape a distance equal to said regular interval in said feeding direction;

a suction member having an air-suction hole open in a lower face thereof, and disposed right above said electronic component at one of plural stops of said electronic component, said suction member being lowered to suck and hold said electronic component by vacuum suction through said air-suction hole and then being lifted to take the electronic component out of each holding pocket;

covering means for covering said opening of at least one of said holding pockets;

a notch formed in said covering means and having a width narrower than that of said electronic component and wider than that of said suction member;

a driving device for moving said covering means into a first position in which said notch is right below said suction member and also into a second position apart from said first position.

10. An apparatus according to claim 9, wherein said covering means comprises a covering member, said notch extends upstream in said feeding direction from a downstream end of the covering member, and said second position is upstream of said suction member as seen in the feeding direction.

11. An apparatus according to claim 10, wherein said carrier tape has a number of engagement holes at regular intervals along said longitudinal direction of said tape, and said tape-feeding device has a feeding member, said feeding member being engaged with at least one of said engagement holes of said carrier tape, being moved in said feeding direction while being engaged with said at least one engagement hole, being disengaged from said at least one engagement hole, and being retracted in a retracting direction opposite to said feeding direction, said covering member being connected to said feeding member so that the covering member and the feeding member are moved together in the same direction.

12. An apparatus according to claim 10, wherein said guide member is elongated in said feeding direction and has a guide groove in a top face thereof for guiding said carrier tape, while said covering member has an inverted-U-letter shape in cross section, the covering member being slidably mounted on said guide member such that each of two lateral walls of the covering member is in sliding contact with a corresponding one of two lateral faces of said guide member, so that said guide groove is covered with said covering member.

* * * * *